(12) United States Patent
Son et al.

(10) Patent No.: US 7,091,094 B2
(45) Date of Patent: Aug. 15, 2006

(54) METHOD OF MAKING A SEMICONDUCTOR DEVICE HAVING A GATE ELECTRODE WITH AN HOURGLASS SHAPE

(75) Inventors: Jeong-Hwan Son, Daejeon (KR); Hyeong-Mo Yang, Choongcheongbuk-Do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 39 days.

(21) Appl. No.: 10/231,094

(22) Filed: Aug. 30, 2002

(65) Prior Publication Data

US 2002/0195671 A1   Dec. 26, 2002

Related U.S. Application Data

(62) Division of application No. 09/767,262, filed on Jan. 23, 2001, now Pat. No. 6,462,389.

(30) Foreign Application Priority Data

Jan. 27, 2000   (KR) .................................. 2000-3936

(51) Int. Cl.
  *H01L 21/336* (2006.01)
(52) U.S. Cl. ..................... 438/282; 438/286
(58) Field of Classification Search ............... 438/282, 438/286
  See application file for complete search history.

(56) References Cited

U.S. PATENT DOCUMENTS

| 4,998,147 A | 3/1991 | Beckwith et al. ............ 357/15 |
| 5,592,012 A | 1/1997 | Kubota ....................... 257/391 |
| 5,701,016 A * | 12/1997 | Burroughes et al. .......... 257/24 |
| 5,701,017 A * | 12/1997 | Patel et al. .................... 257/27 |
| 6,228,663 B1 | 5/2001 | Gardner et al. ............... 438/14 |
| 6,258,672 B1 * | 7/2001 | Shih et al. ................... 438/275 |
| 6,278,165 B1 | 8/2001 | Oowaki et al. ............. 257/110 |
| 6,331,726 B1 * | 12/2001 | Voldman .................... 257/541 |

OTHER PUBLICATIONS

Wolf, Stanley; "Silicon Processing for the VLSI Era vol. 2: Process Integration"; pp. 354-356; 1990; Lattice Press; Sunset Beach, CA.*

* cited by examiner

*Primary Examiner*—George Fourson
*Assistant Examiner*—Fernando L. Toledo

(57) ABSTRACT

The present invention provides a semiconductor device that has reduced a short-channel effect by preventing the effective channel length at the sides of a channel of a transistor from decreasing by forming the length of a gate electrode to be different according to the parts. The semiconductor device according to the present invention includes a semiconductor substrate including active regions where a semiconductor device is to be fabricated and isolation regions for electrically isolating the active regions. A gate electrode is formed to go across the active region. A source and a drain are formed in the active region at both sides of the gate electrode, wherein the length of the gate electrode on the upper surface of the sides of the active region is longer than the length of the gate electrode of the center of the active region.

4 Claims, 2 Drawing Sheets

METHOD OF MAKING A SEMICONDUCTOR DEVICE HAVING A GATE ELECTRODE WITH AN HOURGLASS SHAPE

CROSS-REFERENCE TO RELATED APPLICATIONS

This is a divisional of application Ser. No. 09/767,262 filed on Jan. 23, 2001; now U.S. Pat. No. 6,462,389, the disclosures of which are hereby incorporated by reference herein in their entirety.

This application claims priority to Korean Patent Application No. 3936/2000, filed on Jan. 27, 2000, the disclosure of which is incorporated by reference herein in its entirety.

BACKGROUND OF THE INVENTION

1. Field of the Invention

The present invention relates to a semiconductor device and, in particular, to a semiconductor device capable of reducing a short-channel effect.

2. Description of the Related Art

FIG. 1 illustrates the structure of a conventional semiconductor device or transistor. As illustrated in the drawing, active regions 101 and inactive regions 102 are formed on a semiconductor substrate 100. A word line 103 having a certain width is formed on an upper surface of the semiconductor device 100. The word line 103 includes a pattern of lines carrying a gate oxide film (not shown). The word line 103 crosses the active region 101 in a vertical direction. The word line 103 divides the active region 101 to form a source 104 and a drain 105. In addition, the intersection of the word line 103 with the active region 101 forms a gate electrode 103a in an upper part of the active region 101. A channel is formed when a certain voltage is applied to the gate electrode 103a.

As shown in FIG. 1, Lc is a gate length of the center of the channel, and Le is a gate length of the sides of the channel. In the conventional transistor of FIG. 1, the gate length (Lc) of the center of the channel is the same as the gate length (Le) of the sides of the channel. The conventional transistor having the channel with this type of shape includes a number of disadvantages after implanting impurity ions and annealing the transistor.

FIG. 2 illustrates the conventional transistor after the formation of a lightly doped drain (LDD). Impurity ions are implanted in a portion of the gate electrode 103a. Annealing the transistor diffuses the implanted impurity ions down to the gate electrode 103a, as represented by portions 201. As seen in the drawing, diffusion of the impurity ions occurs more extensively at the corners of the channel than at the center of the channel. A transistor formed by this process has an effective length of the channel of the corners (Leffe) that is relatively shorter than an effective length of the channel of the center (Leffc). As a result, a leakage current is increased and a threshold voltage is lowered at the corners of the channel. For these reasons, it is desirable to form a transistor having an effective length of a channel of the corners that is about equal to an effective length of a channel of the center.

SUMMARY OF THE INVENTION

Accordingly, it is an object of the present invention to provide a semiconductor device which can reduces a short-channel effect by preventing the effective channel length at the corner of a channel of a transistor from decreasing by forming a gate electrode to have different lengths according to the parts.

The semiconductor device according to the present invention includes a semiconductor substrate including active regions where a semiconductor device is to be fabricated and isolation regions for electrically isolating the active regions. A gate electrode is formed to go across the active region. A source and a drain are formed in the active region at both sides of the gate electrode, wherein the length of the gate electrode on the upper surface of the sides of the active region is longer than the length of the gate electrode of the center of the active region.

BRIEF DESCRIPTION OF THE INVENTION

The accompanying drawings, which are incorporated herein and constitute part of this specification, illustrate presently preferred embodiments of the invention, and, together with the general descriptions given above and the detailed descriptions given below, serve to explain features of the invention.

DETAILED DESCRIPTION OF THE PREFERRED EMBODIMENTS

Figure 1:
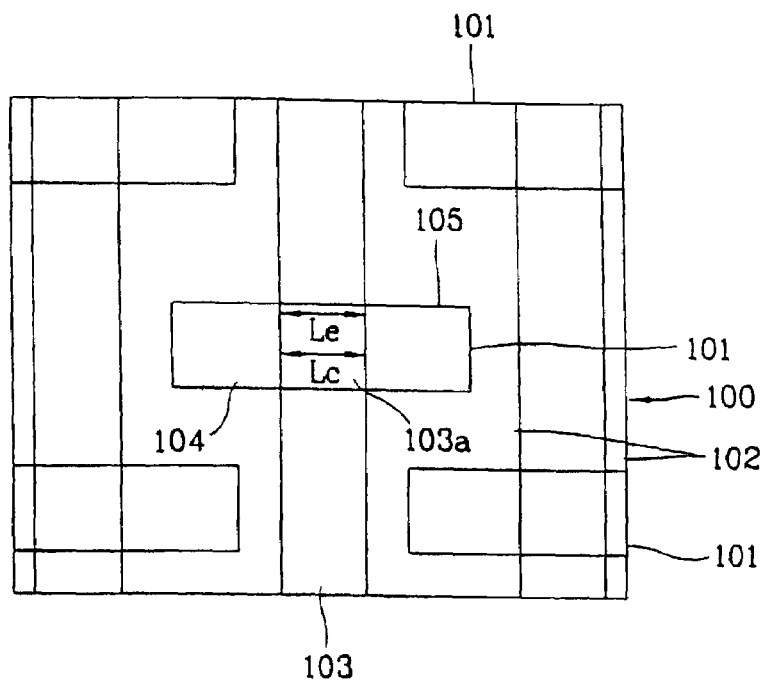
FIG. 1 shows a top view of a conventional semiconductor device.
Figure 2:
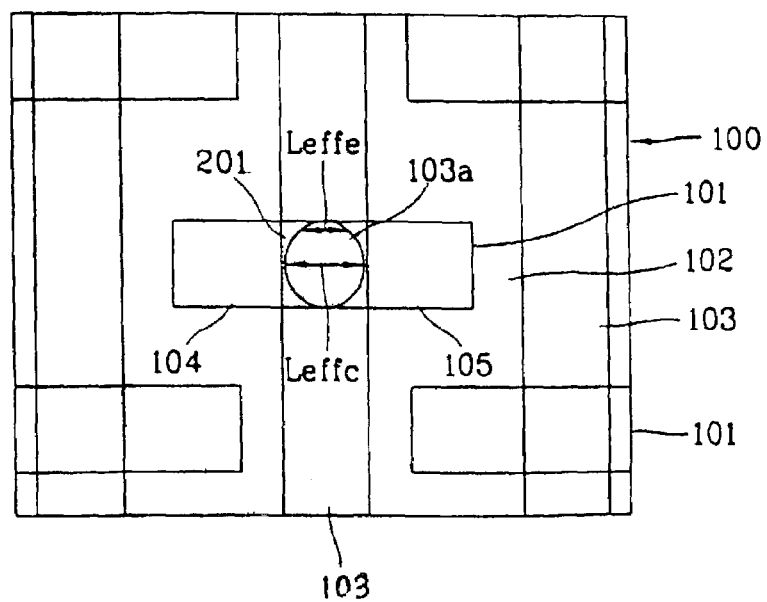
FIG. 2 shows a top view of the device of FIG. 1 showing a diffusion profile of impurity ions.
Figure 3:
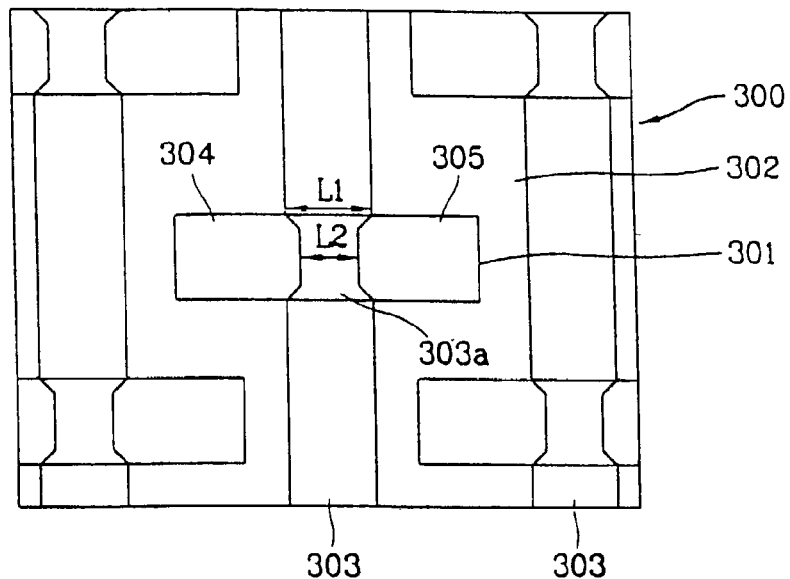
FIG. 3 shows a top view of a semiconductor device according to the present invention.

Referring to the drawings, FIG. 3 shows an example of a semiconductor device or transistor according to the present invention. The semiconductor device includes active regions 301 where a transistor is to be fabricated, and isolation regions 302 for electrically isolating the active regions 301, each formed on a semiconductor substrate. A word line 303 is formed in a generally vertical direction across the active region 301. The word line 303 divides the active region 301 to form a source 304 and a drain 305. The intersection of the word line 303 and the active region 301 forms a gate electrode or region 303a in an upper part of the active region 301.

The gate region 303a includes a length L1 on an upper surface of the sides of the gate region 303a of the active region 301, and a length L2 on an upper surface of the center of the gate region 303a. The length of the sides of the gate region (L1) is greater than the length of the center of the gate region (L2). Thus, as shown in FIG. 3, the gate region 303a is in the shape of a "dumbbell" or an "hourglass", wherein the center length L2 is relatively shorter than the side length L1.

Figure 4:
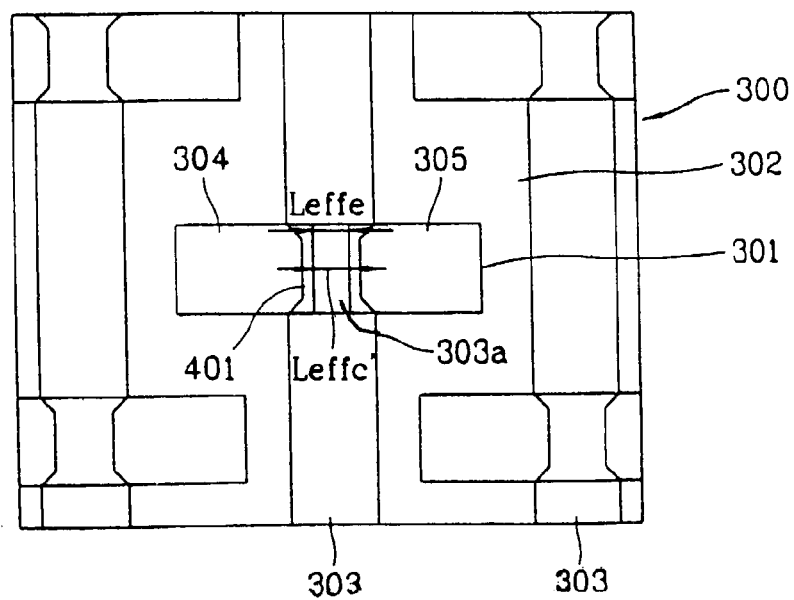
FIG. 4 shows a top view of the device of FIG. 3 showing a diffusion profile of impurity ions.

FIG. 4 shows a diffusion profile of impurity ions. Impurity ions are diffused down to the gate electrode 303a, represented by doped region 401. As illustrated in the drawing, although the impurity ions are diffused more extensively at the side of gate electrode 303a, an effective channel length of the sides of the channel (Leffe') is about the same as an effective channel length of the center of the channel (Leffc'). Thus, a lightly doped drain (LDD) or a source/drain region having impurity ions diffused more extensively channel can be formed where the effective lengths at the sides and the center of the channel (Leffe' and Leffc', respectively) are about the same. As a result, leakage current and threshold voltage decreases caused by longer effective channel lengths at the center than at the sides are eliminated.

While the present invention has been disclosed with reference to certain preferred embodiments, numerous modifications, alterations, and changes to the described embodiments are possible without departing from the sphere and scope of the present invention, as defined in the appended claims. Accordingly, it is intended that the present invention not be limited to the described embodiments, but that it have the full scope defined by the language of the following claims, and equivalents thereof.

What is claimed is:

1. A method of manufacturing a semiconductor, comprising:

disposing a source and a drain on a semiconductor substrate;

disposing a gate electrode between the source and the drain, the gate electrode having an edge length disposed at an edge of the source and the drain, and a center length disposed at a center between the source and the drain, the edge length being substantially greater than the center length; and doping a portion of the gate electrode to form doped edge and center lengths and undoped edge and center lengths, said doped edge length being greater than said doped center length, and said undoped edge length being about the same as the undoped center length to form a channel region with an effective length that is about the same throughout the entire channel region.

2. A method of manufacturing a semiconductor, comprising:

disposing a source on a semiconductor substrate;

disposing a drain on said semiconductor substrate;

disposing a gate electrode between the source and the drain, the gate electrode having an edge length disposed at an edge of the source and the drain, and a center length disposed at a center of the source and the drain, wherein the edge length is substantially greater than the center length; and forming a channel region below said gate electrode, an effective channel length at a center of said channel region being about the same as the effective channel length at edges of said channel region such that the effective channel length of said entire channel region below said gate electrode having about the same length throughout.

3. The method according to claim 2, wherein said step of forming the channel region includes:

doping a portion of the gate electrode to form doped edge and center lengths and undoped edge and center lengths, wherein the undoped edge length is about the same as the undoped center length.

4. The method according to claim 3, wherein the doped edge length is about greater than the doped center length.

* * * * *